(12) United States Patent
Bedell et al.

(10) Patent No.: US 10,083,850 B2
(45) Date of Patent: *Sep. 25, 2018

(54) METHOD OF FORMING A FLEXIBLE SEMICONDUCTOR LAYER AND DEVICES ON A FLEXIBLE CARRIER

(71) Applicant: International Business Machines Corporation, Armonk, NY (US)

(72) Inventors: Stephen W. Bedell, Wappingers Falls, NY (US); Devendra K. Sadana, Pleasantville, NY (US); Katherine L. Saenger, Ossining, NY (US); Abdelmajid Salhi, Riyadh (SA)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/404,362

(22) Filed: Jan. 12, 2017

(65) Prior Publication Data

US 2017/0125277 A1 May 4, 2017

Related U.S. Application Data

(60) Continuation of application No. 15/145,986, filed on May 4, 2016, now Pat. No. 9,659,807, which is a (Continued)

(51) Int. Cl.
*H01L 21/68* (2006.01)
*H01L 21/683* (2006.01)
*H01L 21/78* (2006.01)

(52) U.S. Cl.
CPC .......... *H01L 21/6836* (2013.01); *H01L 21/78* (2013.01); *H01L 2221/68318* (2013.01);
(Continued)

(58) Field of Classification Search
CPC ................. H01L 21/6836; H01L 21/78; H01L 2221/68318; H01L 2221/68327;
(Continued)

(56) References Cited

U.S. PATENT DOCUMENTS 7,923,629 B2   4/2011   Park et al.
9,496,165 B1*  11/2016  Bedell ................. H01L 21/6835
(Continued)

FOREIGN PATENT DOCUMENTS

JP    2009010356 A    1/2009
JP    5041686 B2     10/2012
(Continued)

*Primary Examiner* — Scott B Geyer
(74) *Attorney, Agent, or Firm* — Harrington & Smith; Louis J. Percello

(57) ABSTRACT

A method for fabricating a semiconductor device comprises providing a preformed spalled structure comprising a stressor layer stack on a first surface of a semiconductor substrate; forming an interfacial release layer on an exposed second surface of the semiconductor substrate; adhesively bonding the interfacial release layer to a rigid handle substrate using an epoxy; removing at least a portion of the stressor layer stack from the first surface of the semiconductor substrate; processing the semiconductor substrate; and removing the semiconductor substrate from the interfacial release layer to impart flexibility to the semiconductor substrate.

16 Claims, 20 Drawing Sheets

Related U.S. Application Data division of application No. 14/795,019, filed on Jul. 9, 2015, now Pat. No. 9,496,165.

(52) U.S. Cl.
CPC ............... *H01L 2221/68327* (2013.01); *H01L 2221/68381* (2013.01)

(58) Field of Classification Search
CPC ....... H01L 2221/68381; H01L 31/1892; H01L 21/2855; H01L 21/32051; H01L 21/321; H01L 21/304; H01L 21/30; H01L 21/46; B26F 3/00; C30B 33/06; Y10T 225/10; Y02E 10/50
See application file for complete search history.

(56) References Cited

U.S. PATENT DOCUMENTS

| | | |
|---|---|---|
| 9,659,807 B2* | 5/2017 | Bedell .................. H01L 21/6835 |
| 2009/0017599 A1 | 1/2009 | Eguchi et al. |
| 2010/0311250 A1 | 12/2010 | Bedell et al. |
| 2012/0318341 A1 | 12/2012 | Fisher et al. |
| 2014/0251548 A1 | 9/2014 | Bedell et al. |
| 2015/0187572 A1 | 7/2015 | Girt et al. |
| 2016/0087577 A1 | 3/2016 | Albadri et al. |

FOREIGN PATENT DOCUMENTS

| | | |
|---|---|---|
| KR | 101010023 B1 | 1/2011 |
| KR | 101203090 B1 | 11/2012 |
| WO | 2007019487 A2 | 2/2007 |
| WO | 2012046428 A1 | 4/2012 |

* cited by examiner

METHOD OF FORMING A FLEXIBLE SEMICONDUCTOR LAYER AND DEVICES ON A FLEXIBLE CARRIER

CROSS REFERENCE

This patent application is a continuation application of U.S. patent application Ser. No. 15/145,986, filed May 4, 2016, which is a divisional application of U.S. patent application Ser. No. 14/795,019, filed Jul. 9, 2015, the disclosures of which are incorporated by reference herein in their entireties.

BACKGROUND

The exemplary embodiments described herein relate generally to semiconductor devices and methods for the fabrication thereof and, more specifically, to methods of using an interfacial release layer to temporarily bond a flexible semiconductor layer to a substrate for the subsequent transfer of the flexible semiconductor layer to a flexible carrier.

Flexible semiconductor layers produced by spalling techniques (described in U.S. Patent Application Publication No. 2010/0311250 A1 to Bedell et al.) can be difficult to process. Such techniques generally employ the temporary bonding of a flexible semiconductor layer to a handle substrate and subsequent separation of the flexible semiconductor layer from the handle substrate. The temporary bonding is often incompatible with various processing parameters. For example, processing of the semiconductor layer/handle substrate assembly may occur at temperatures as high as 180 degrees C. to 250 degrees C. After processing at such temperatures, separation of the semiconductor layer from the handle substrate without causing damage to the semiconductor layer may be difficult.

The difficulty in separation of the semiconductor layer from the handle substrate is generally the result of the temporary bonding utilizing easy-release tapes that are either not stable at the processing temperatures required or which lose their easy-release properties after being exposed to such temperatures. In addition, air bubbles at the tape/semiconductor layer interface are easy to form yet difficult to remove, the difficulty in removing such bubbles resulting from the tape not being be easily peeled from the semiconductor layer and repositioned without incurring damage.

Difficulty in separation of the semiconductor layer from the handle substrate may also be the result of approaches that utilize epoxies to bond the various layers of the devices. The use of epoxies may appear to be more forgiving than those that employ tapes since (unlike tapes) interfacial air bubbles may be kneaded out of the epoxy before setting occurs. Many epoxies also have the advantage of being stable to the temperatures at which processing occurs. However, adhesive bonds with epoxies are generally permanent, which thereby inhibits clean separation of the semiconductor layer from the handle substrate.

BRIEF SUMMARY

In one exemplary aspect, a method for fabricating a semiconductor device comprises providing a preformed spalled structure comprising a stressor layer stack on a first surface of a semiconductor substrate; forming an interfacial release layer on an exposed second surface of the semiconductor substrate; adhesively bonding the interfacial release layer to a rigid handle substrate using an epoxy; removing at least a portion of the stressor layer stack from the first surface of the semiconductor substrate; processing the semiconductor substrate; and removing the semiconductor substrate from the interfacial release layer to impart flexibility to the semiconductor substrate.

In another exemplary aspect, a method for fabricating a semiconductor device comprises providing a preformed spalled structure comprising a stressor layer stack on a first surface of a semiconductor substrate; forming an interfacial release layer on a second exposed surface of the semiconductor substrate; bonding the interfacial release layer to a rigid handle substrate using an epoxy adhesive; removing at least a portion of the stressor layer stack from the semiconductor substrate; processing the semiconductor substrate; applying a back contact layer to the semiconductor layer; isolating cells in the back contact layer in the semiconductor substrate; and removing the semiconductor substrate from the interfacial release layer using a pressure-sensitive carrier tape to impart flexibility to the semiconductor substrate.

In another exemplary aspect, a method for fabricating a semiconductor device comprises providing a preformed spalled structure comprising a stressor layer stack on a first surface of a semiconductor substrate; forming an interfacial release layer on a second exposed surface of the semiconductor substrate; bonding the interfacial release layer to a rigid handle substrate using an epoxy adhesive; removing at least a portion of the stressor layer stack from the semiconductor substrate; processing the semiconductor substrate; forming a layer comprising a finger/bus metal and an anti-reflective coating on the semiconductor substrate; applying a sacrificial mask to the layer comprising the finger/bus metal and the anti-reflective coating; patterning the layer comprising the finger/bus metal and the anti-reflective coating; removing the sacrificial mask; and removing the semiconductor substrate from the interfacial release layer using a tape superstrate to impart flexibility to the semiconductor substrate.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

Exemplary embodiments of methods for forming flexible semiconductor layers and devices on flexible carriers and structures associated therewith are disclosed herein. Such methods and structures include, but are not limited to, the use of temporary bonding layers comprising epoxies in conjunction with release layers and spalling techniques. However, it should be understood that the disclosed embodiments are merely illustrative of the claimed methods and structures and that such methods and structures may be embodied in various forms. The methods and structures disclosed herein may be embodied in many different forms and should not be construed as limited to the exemplary embodiments set forth herein.

The spalling techniques used to form the flexible semiconductor layers on the flexible carriers allow for controlled removal of relatively thin layers of semiconductor materials forming the semiconductor layers from rigid handle substrates to which the semiconductor layers are transferred.

Figure 1A:
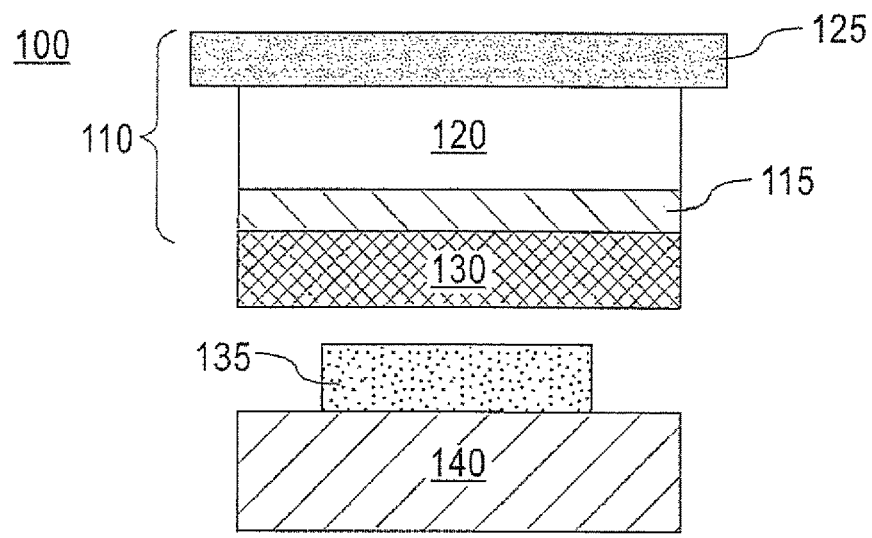
FIGS. 1A through 1D are schematic representations of exemplary methods of temporarily bonding a flexible semiconductor device to a flexible carrier.

Referring to FIGS. 1A through 1D, one exemplary method of forming a flexible semiconductor layer on a flexible carrier is shown generally at 100 and is hereinafter referred to as "method 100." As shown in FIG. 1A, a preformed spalled structure is provided, the structure comprising a spall-inducing stressor layer stack 110 (comprising at least, for example, an adhesion layer 115, a seed/stressor layer 120, and a transfer tape 125) attached to a flexible semiconductor material 130, which is made to contact an epoxy adhesive 135 disposed on a rigid handle substrate 140 such that the flexible semiconductor material 130 interfacially engages the epoxy adhesive 135.

Figure 1B:
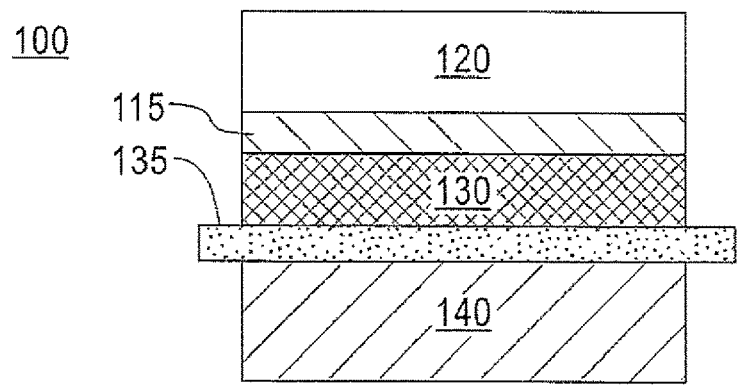

As shown in FIG. 1B, pressure is applied to one or both of the stressor layer stack 110 and the rigid handle substrate 140 such that the epoxy adhesive 135 is substantially uniformly distributed on the rigid handle substrate 140. The epoxy adhesive is then typically cured at a temperature of from about 40° C. to 150° C. for a period of time between about 0.1 hours to about 5 hours. The transfer tape 125 is removed from the stressor layer stack 110 after the curing step.

Figure 1C:
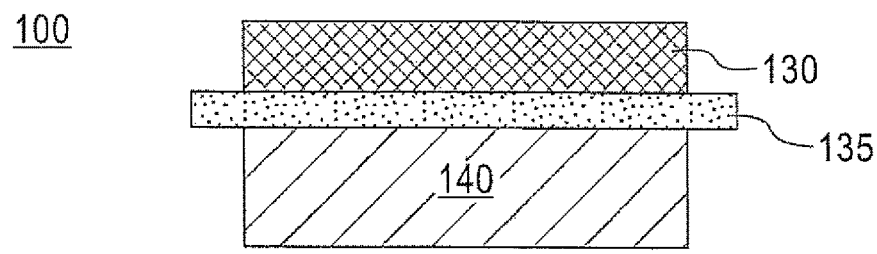
Figure 1D:
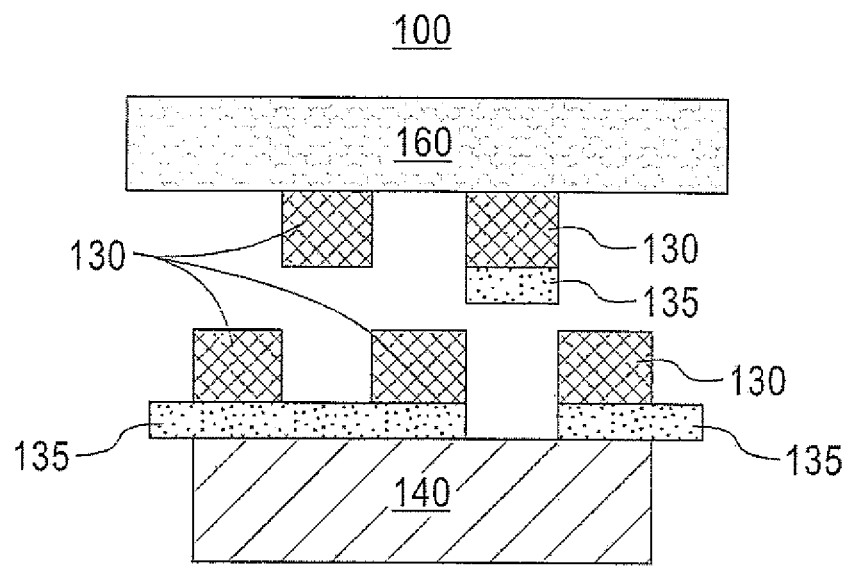

As shown in FIG. 1C, the adhesion layer 115 and the seed/stressor layer 120 are removed from the flexible semiconductor material 130, and at this point the flexible semiconductor material 130 has been transferred to the rigid handle substrate 140.

As shown in FIG. 10, a peel tape (pressure-sensitive carrier tape 160) is applied to the flexible semiconductor material 130 and is used to remove the flexible semiconductor material 130 from the epoxy adhesive 135. As shown, removing the flexible semiconductor material 130 using this technique may result in a less than desirable transfer of the flexible semiconductor material 130, such as an incomplete separation of the flexible semiconductor material 130 from the epoxy adhesive 135 or a disintegration of the flexible semiconductor material 130 and/or epoxy adhesive 135.

Referring now to FIGS. 2A through 2E, one exemplary method of using an interfacial release layer in forming a flexible semiconductor layer on a flexible carrier is shown generally at 200 and is hereinafter referred to as "method 200." Method 200 allows for the temporary bonding of the semiconductor layer to a rigid or semi-rigid substrate coated with an epoxy adhesive followed by the transfer of the flexible semiconductor layer to the flexible carrier.

Figure 2A:
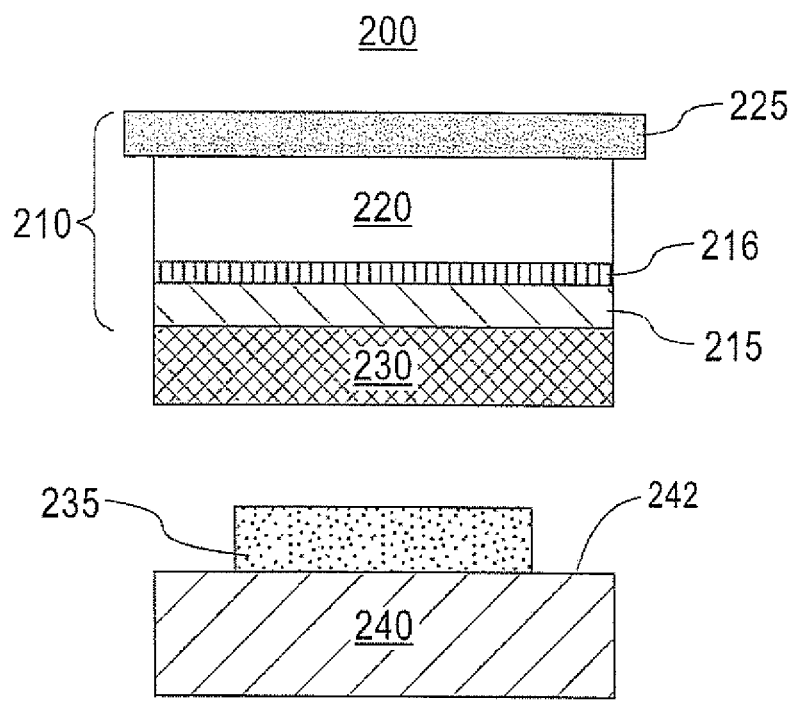
FIGS. 2A through 2D are schematic representations of exemplary methods of temporarily bonding a flexible semiconductor device to a flexible carrier using a release layer.

As shown in FIG. 2A, the epoxy adhesive (shown at 235) is disposed on a handle substrate 240. The epoxy adhesive 235 may comprise an electrically conductive epoxy comprising silver. The handle substrate 290 may be rigid or semi-rigid and has a front surface 242 (at least a portion of which receives the epoxy adhesive 235) and a back surface 244. In exemplary embodiments in which the handle substrate 240 is rigid, materials from which the handle substrate 240 may be formed include, but are not limited to, Si, Ge, quartz, borosilicate glass, sapphire, metals, ceramics, combinations of the foregoing materials, and the like.

Still referring to FIG. 2A, a preformed spalled structure is provided comprising a spall-inducing stressor layer stack 210 that is attached to a semiconductor layer 230. The stressor layer stack 210 may comprise an adhesion layer 215 of titanium (deposited on the semiconductor layer 230), a seed layer 216 of nickel on the adhesion layer 215, a stressor layer 220 of nickel deposited onto the seed layer, and an ultraviolet (UV) releasable tape 225 applied to the stressor layer 220. The semiconductor layer 230 (e.g., a 100-oriented silicon material forming a substrate or any material selected from the group consisting of silicon, germanium, SiGe, bulk III-V materials, any of the foregoing materials further including epitaxially grown semiconductor layers, any of the foregoing materials further including doped layers, metallic layers, and/or passivating layers, and combinations of the foregoing) has an exposed front surface and a back surface to which the stressor layer stack 210 is attached. A contact-hole patterned passivation layer may also be deposited on the semiconductor layer 230, with a blanket conductive layer in contact with the passivation layer and the semiconductor layer 230 exposed by the contact-holes. Methods by which the adhesion layer 215 is deposited on the seed layer and the seed layer is deposited on the adhesion layer 215 include, but are not limited to, thermal evaporation, or sputtering.

Figure 2B:
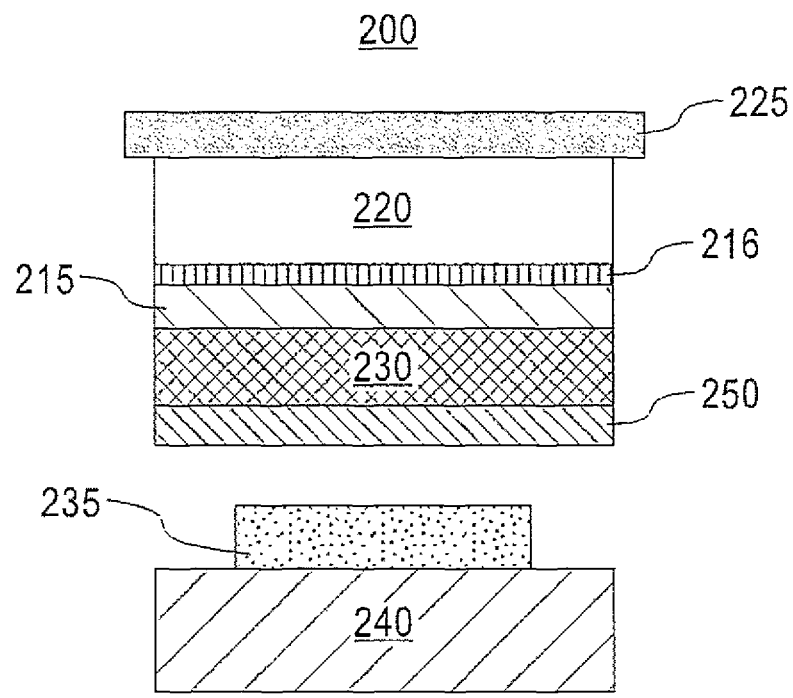

As shown in FIG. 2B, an interfacial release layer (shown at 250) is formed on an exposed surface of the semiconductor layer 230 prior to bonding of the semiconductor layer 230 with the interfacial release layer 250 to the epoxy adhesive 235 on the handle substrate 240. When the semiconductor layer 230 comprises a silicon or silicon oxide-containing semiconductor material, the interfacial release layer 250 comprises aluminum. However, while aluminum on a native silicon oxide-containing semiconductor material provides a suitable interfacial release layer 250, other materials (alone or in combination with aluminum) may be used as well. For example, carbon or hydrocarbon contamination may be introduced to the silicon surface prior to the aluminum deposition. Suitable methods for depositing the aluminum interfacial release layer 250 onto the semiconductor layer 230 include, but are not limited to, thermal evaporation, or sputtering.

Figure 2C:
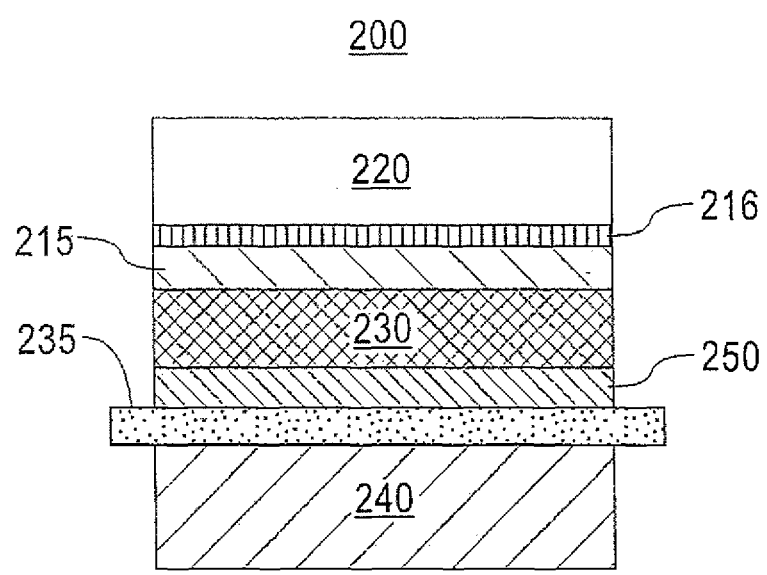

As shown in FIG. 2C, the interfacial release layer 250, along with the attached semiconductor layer 230, is transferred and bonded to the epoxy adhesive 235 on the handle substrate 240 using pressure to substantially uniformly distribute the epoxy adhesive on at least a portion of the front surface 242 of the handle substrate 240, thereby facilitating a substantially bubble-free epoxy adhesive bond between the handle substrate 240 and the semiconductor layer 230. The epoxy adhesive is then typically cured at a temperature of from about 40° C. to about 150° C. for a period of time between about 0.1 hours to about 5 hours. The UV releasable tape 225 is removed from the stressor layer 220.

Figure 2D:
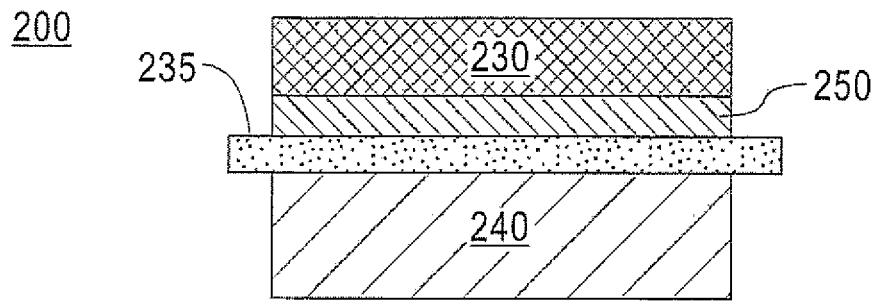

As shown in FIG. 2D, some or all of the stressor layer stack 210 is removed from the semiconductor layer 230 (for example, by an etching process or an acid wash). Processing steps (e.g., patterning, thermal treatments (such as heating, if necessary), film depositions, and the like) are then performed on the semiconductor layer 230 as well as on any layers thereupon formed (e.g., from the patterning, film depositions) to form a processed semiconductor layer 230 that is flexible upon release from handle substrate 240. At least a portion of the processed, flexible semiconductor layer 230 desired for removal from the interfacial release layer 250 is identified and then contacted with the pressure-sensitive carrier tape 260.

Figure 2E:
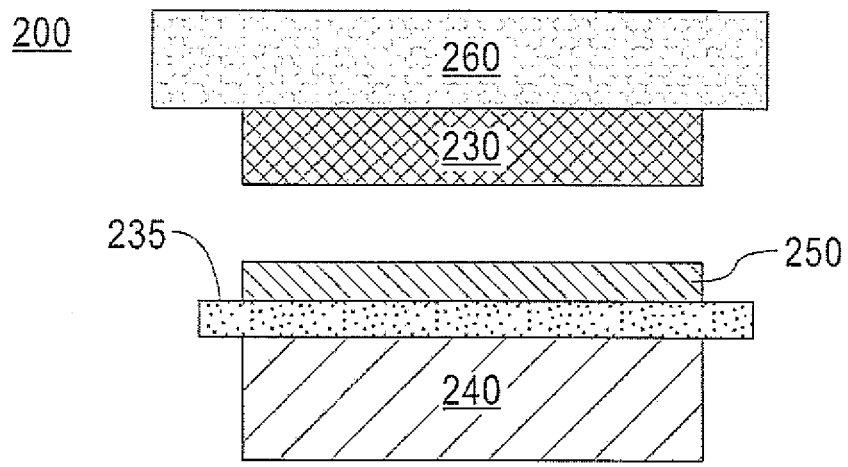
FIG. 2E is a schematic representation of using pressure-sensitive carrier tape to remove the flexible semiconductor device from the release layer.

As shown in FIG. 2E, a tape-initiated separation process is carried out using the pressure-sensitive carrier tape 260. In the tape-initiated separation process, the flexible semiconductor layer 230 is peeled away from the interfacial release layer 250, leaving the interfacial release layer 250 on the epoxy adhesive 235 and at least a portion of the processed, flexible semiconductor layer 230 on the pressure-sensitive carrier tape 260. The interfacial release layer 250 has the property of being sufficiently adhesive to the flexible semiconductor layer 230 and the epoxy adhesive 235 during the processing but is weakly adhesive enough to allow for the separation of the flexible semiconductor layer 230 from the interfacial release layer 250 after processing.

Referring now to FIGS. 3A through 5L, various exemplary methods of forming a flexible semiconductor layer on a flexible carrier layer are shown. In such exemplary methods, desired processing steps may include patterning a semiconductor layer into separate chiplet regions, with each chiplet region being individually attached to an underlying epoxy layer.

As shown in FIGS. 3A through 3F, one exemplary method of producing a semiconductor device is shown generally at 300 and is hereinafter referred to as "method 300." In method 300, processing of the flexible semiconductor layers is minimal. For example, in a first exemplary method of processing, an additional blanket layer may be included between the flexible semiconductor layer and the flexible tape (FIGS. 3G and 3H), and in a second exemplary method of processing, the flexible semiconductor layer may be disposed directly on the flexible tape (FIGS. 3I and 3J).

Figure 3A:
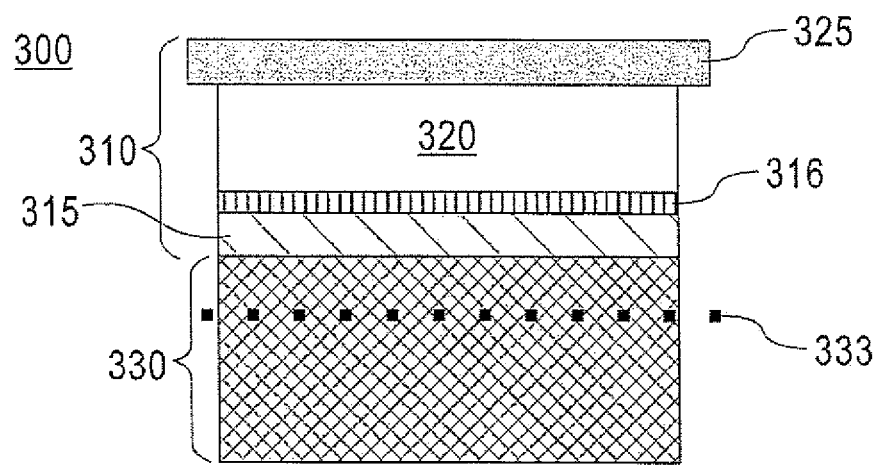
FIGS. 3A through 3E are schematic representations of exemplary methods of temporarily bonding a flexible semiconductor device to a rigid handle substrate using a release layer.

As shown in FIG. 3A, a spall-inducing stressor layer stack 310 is formed and deposited onto a substrate comprising a semiconductor material (e.g., a 100-oriented silicon material forming a substrate or any material selected from the group consisting of silicon, germanium, SiGe, bulk III-V materials, any of the foregoing materials further including epitaxially grown semiconductor layers, any of the foregoing materials further including doped layers, metallic layers, and/or passivating layers, and combinations of the foregoing) configured to form a minimally processed flexible semiconductor layer 330. The stressor layer stack 310 comprises an adhesion layer 315 of titanium deposited on the semiconductor material forming the semiconductor layer 330 as well as a seed layer 316 of nickel deposited on the adhesion layer 315. A contact-hole patterned passivation layer may also be deposited on the semiconductor layer 330, with a blanket conductive layer in contact with the passivation layer and the semiconductor layer 330 exposed by the contact-holes. Methods by which the adhesion layer 315 is deposited on the semiconductor layer and the seed layer is deposited on the adhesion layer 315 include, but are not limited to, thermal evaporation or sputtering. A stressor layer 320 of nickel may be deposited onto the seed layer. An ultraviolet (UV) releasable tape 325 may then be applied to the stressor layer 320.

Figure 3B:
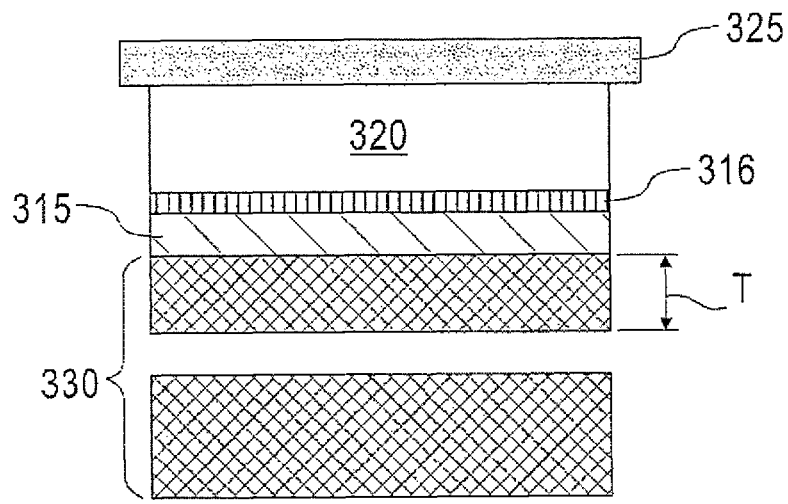

The process of controlled spalling separates semiconductor material 330 at a plane 333 extending longitudinally through the semiconductor material 330 parallel to the adhesion layer 315. Separation of the semiconductor material 330 may be facilitated by mechanically guiding the ultraviolet (UV) releasable transfer tape 325 to induce and sustain spalling mode fracture. Separation along plane 333 results in the semiconductor material 330 having reduced thickness T as shown in FIG. 3B making the thinner semiconductor material 330 have increased flexibility. The lower portion of the semiconductor material 330 may be discarded or recycled.

Figure 3C:
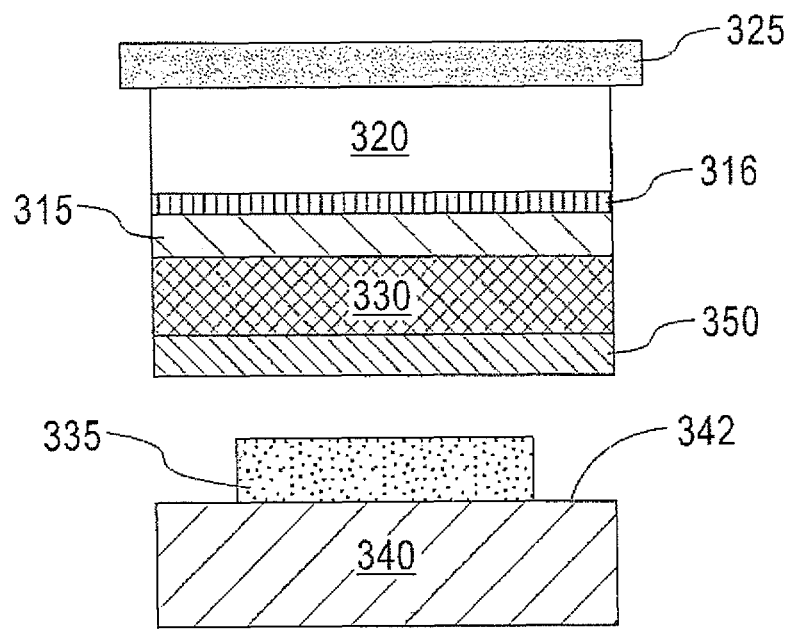

As shown in FIG. 3C, an interfacial release layer 350 is formed on an exposed surface of the semiconductor layer 330 prior to bonding of the stressor layer stack 310 and the semiconductor layer 330 to epoxy adhesive 335 on a handle substrate 340. When the semiconductor layer 330 comprises a silicon or silicon oxide-containing semiconductor material, the interfacial release layer 350 comprises aluminum. However, while aluminum on a native silicon oxide-containing semiconductor material provides a suitable interfacial release layer 350, other materials (alone or in combination with aluminum) may be used as well. For example, carbon or hydrocarbon contamination may be introduced to the silicon surface prior to the aluminum deposition. Suitable methods for depositing the aluminum interfacial release layer 350 onto the semiconductor layer 330 include, but are not limited to, thermal evaporation or sputtering.

Figure 3D:
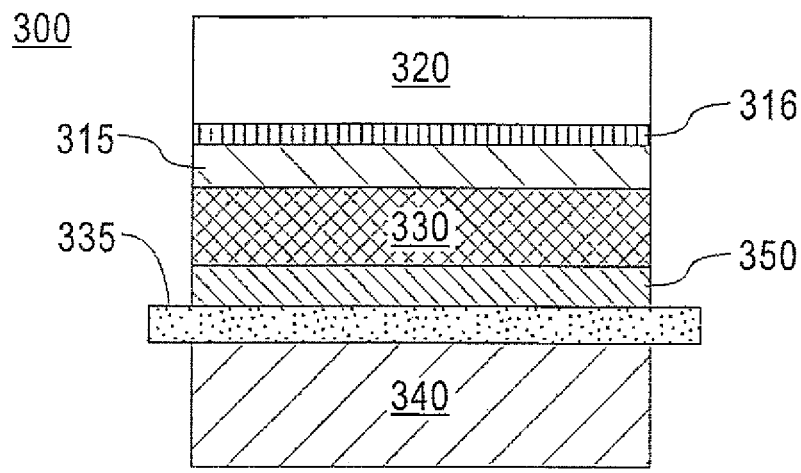

As shown in FIG. 3D, the interfacial release layer 350, along with the attached semiconductor layer 330, is transferred and bonded to the epoxy adhesive 335 on the handle substrate 340 using pressure to substantially uniformly distribute the epoxy adhesive 335 on at least a portion of a front surface 342 of the handle substrate 340, thereby facilitating a substantially bubble-free epoxy adhesive bond between the handle substrate 340 and the semiconductor layer 330. The epoxy adhesive is then typically cured at a temperature of from about 40° C. to about 150° C. for a period of time between about 0.1 hours to about 5 hours. The UV releasable tape 325 is removed from the stressor layer 320.

Figure 3E:
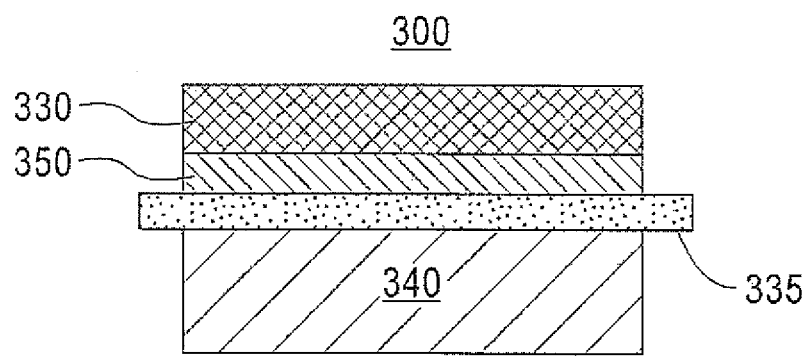

As shown in FIG. 3E, some or all of the stressor layer stack 310 is removed from the semiconductor layer 330 (for example, by an etching process or an acid wash). Processing steps (e.g., patterning, thermal treatments (such as heating, if necessary), film depositions, and the like) are then performed on the semiconductor layer 330 as well as on any layers thereupon formed (e.g., from the patterning, film depositions) to form a processed semiconductor layer 330 that is flexible upon release from the handle substrate 340.

Figure 3F:
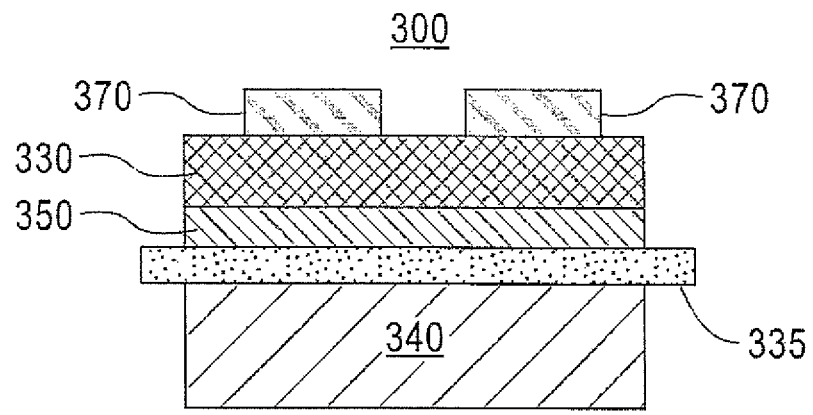
FIGS. 3F and 3G are schematic representations of forming and isolating cells in the flexible semiconductor device of FIGS. 3A through 3E using a blanket layer of hardmask.

Referring now to FIG. 3F, processing can be provided to include cell isolation (if desired). In one exemplary embodiment of isolating cells in the flexible semiconductor layer 330 a hardmask 370 is deposited as a blanket layer on the flexible semiconductor layer 330 and is patterned and etched through a photoresist (PR) mask. In another exemplary embodiment of isolating cells also using a patterned hardmask, hardmask material is deposited through a shadow mask. In either embodiment, the hardmask deposition may occur as shown and described here or prior to the application of the stressor layer stack 310. In yet another exemplary embodiment of isolating cells, laser scribing of the flexible semiconductor layer 330 may be carried out. In any embodiment, a contiguous region of the semiconductor layer 330 may be identified, such a region including a majority of the surface of the semiconductor layer. The processing may include the forming of a cell front structure on the region defined by the majority of the surface.

Figure 3G:
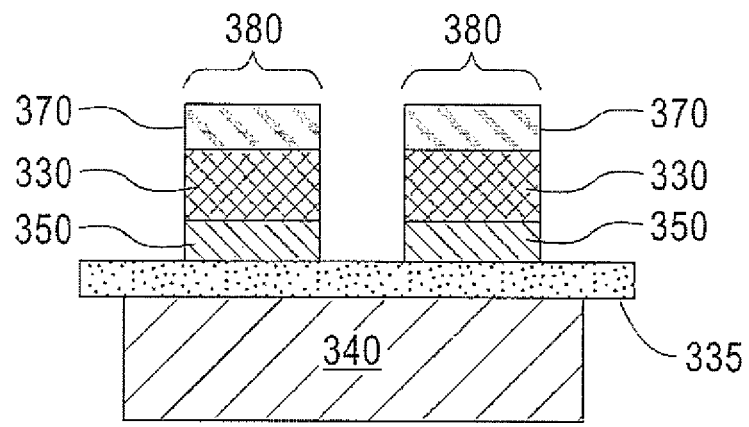

As shown in FIG. 3G, the cells (shown at 380) are isolated from each other by wet or dry etching and supported by the epoxy adhesive 335.

Figure 3H:
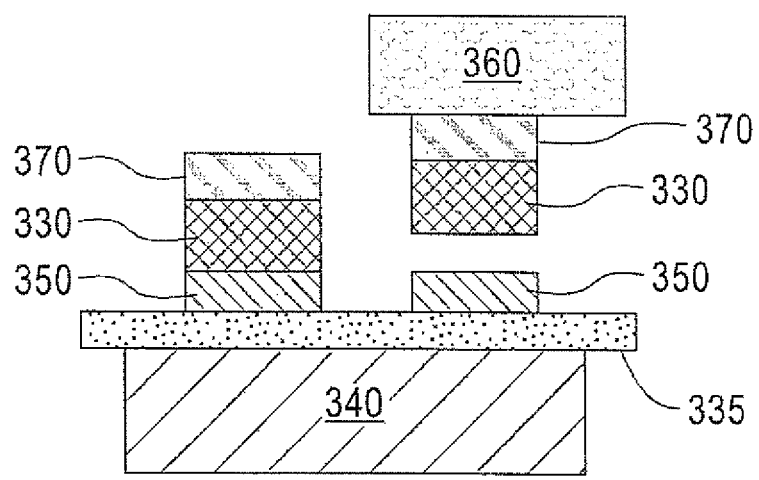
FIG. 3H is a schematic representation of using pressure-sensitive carrier tape to remove the flexible semiconductor device and a layer of hardmask from the release layer.
Figure 3I:
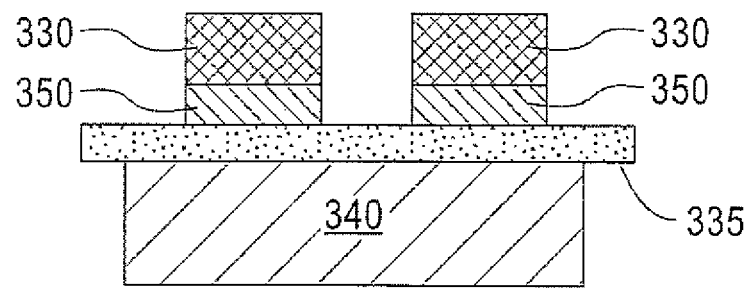
FIGS. 3I and 3J are schematic representations of using pressure-sensitive carrier tape to remove the flexible semiconductor device from the release layer.
Figure 3J:
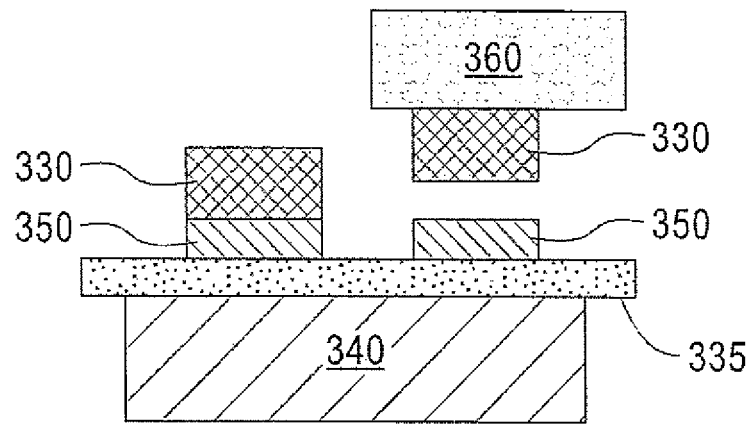

The first exemplary method of processing the cells 380 (additional blanket layer included between the flexible semiconductor layer and the flexible tape) is illustrated in FIG. 3H. In such a method of processing, the flexible pressure-sensitive carrier tape 360 is disposed on the hardmask 370 deposited as the blanket layer. The cell 380 is selectively removed from the interfacial release layer 350 by removal of the flexible pressure-sensitive carrier tape 360, which removes the portion of the flexible semiconductor layer 330 defining the cell 380 and the hardmask 370.

The second exemplary method of processing the cells 380 (flexible semiconductor layer disposed directly on the flexible tape) is illustrated in FIGS. 3I and 3J. In such a method of processing, the hardmask 370 is removed (e.g., by etching), and the flexible pressure-sensitive carrier tape 360 is disposed directly on the flexible semiconductor layer 330 and is used to remove the portion of the flexible semiconductor layer 330 defining the cell 380.

As shown in FIGS. 4A through 4I, another exemplary method of producing a semiconductor device is shown generally at 400 and is hereinafter referred to as "method 400." In method 400, processing is performed on a back surface of the device before processing is performed on a front surface of the device.

Figure 4A:
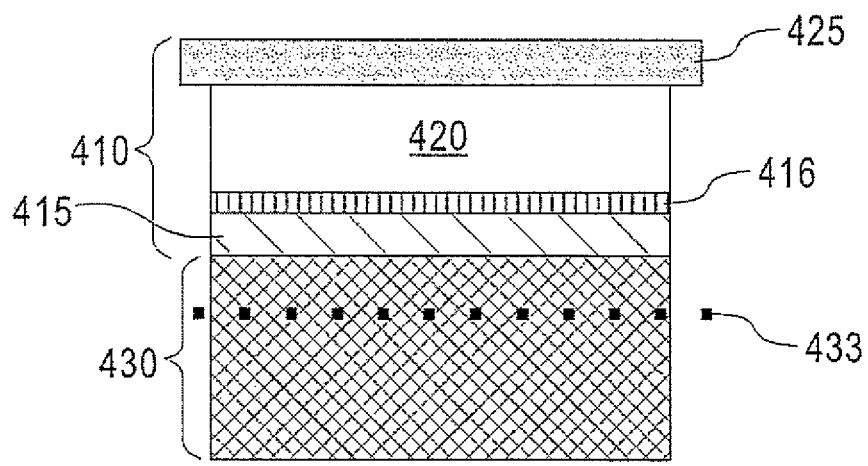
FIGS. 4A through 4E are schematic representations of exemplary methods of temporarily bonding a flexible semiconductor device to a rigid handle substrate using a release layer.

As shown in FIG. 4A, a spall-inducing stressor layer stack 410 is formed and deposited onto a substrate comprising a semiconductor material (e.g., a 100-oriented silicon material forming a substrate or any material selected from the group consisting of silicon, germanium, SiGe, bulk III-V materials, any of the foregoing materials further including epitaxially grown semiconductor layers, any of the foregoing materials further including doped layers, metallic layers, and/or passivating layers, and combinations of the foregoing) forming a semiconductor layer 430 configured to have an exposed front surface and a back surface that receives the stressor layer stack 410. A contact-hole patterned passivation layer may also be deposited on the semiconductor layer 430, with a blanket conductive layer in contact with the passivation layer and the semiconductor layer 430 exposed by the contact-holes. The stressor layer stack 410 comprises an adhesion layer 415 of titanium deposited on the back surface of the semiconductor layer 430 as well as a seed layer 416 of nickel deposited on the adhesion layer 415, deposition being by, for example, sputtering. A stressor layer 420 of nickel may be deposited onto the seed layer. An ultraviolet (UV) releasable tape 425 may then be applied to the stressor layer 420.

Figure 4B:
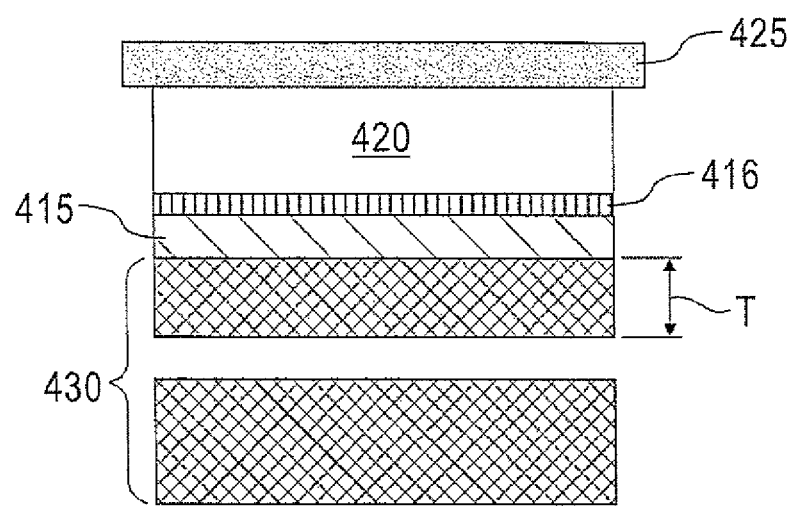

The semiconductor layer 430 may be separated at a plane 433 extending longitudinally through the semiconductor layer 430 parallel to the adhesion layer 415. Separation of the semiconductor layer 430 may result in the semiconductor layer 430 having reduced thickness T as shown in FIG. 4B.

Figure 4C:
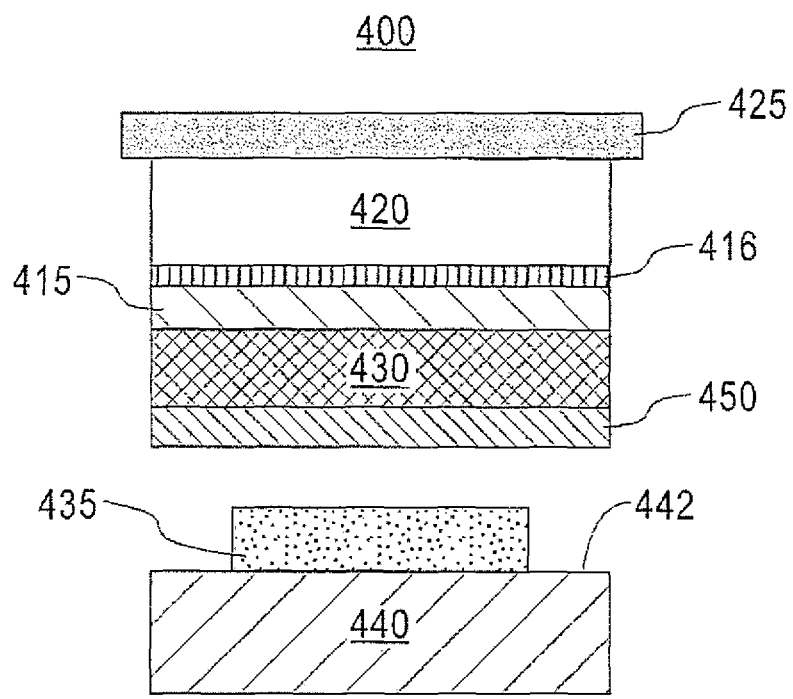

As shown in FIG. 4C, an interfacial release layer 450 is formed on an exposed surface of the semiconductor layer 430 prior to bonding of the stressor layer stack 410 and the semiconductor layer 430 to the epoxy adhesive 435 on a handle substrate 440. When the semiconductor layer 430 comprises a silicon or silicon oxide-containing semiconductor material, the interfacial release layer 450 comprises aluminum. However, while aluminum on a native silicon oxide-containing semiconductor material provides a suitable interfacial release layer 450, other materials (alone or in combination with aluminum) may be used as well. For example, carbon or hydrocarbon contamination may be introduced to the silicon surface prior to the aluminum deposition. Suitable methods for depositing the aluminum interfacial release layer 450 onto the semiconductor layer 430 include, but are not limited to, thermal evaporation.

Figure 4D:
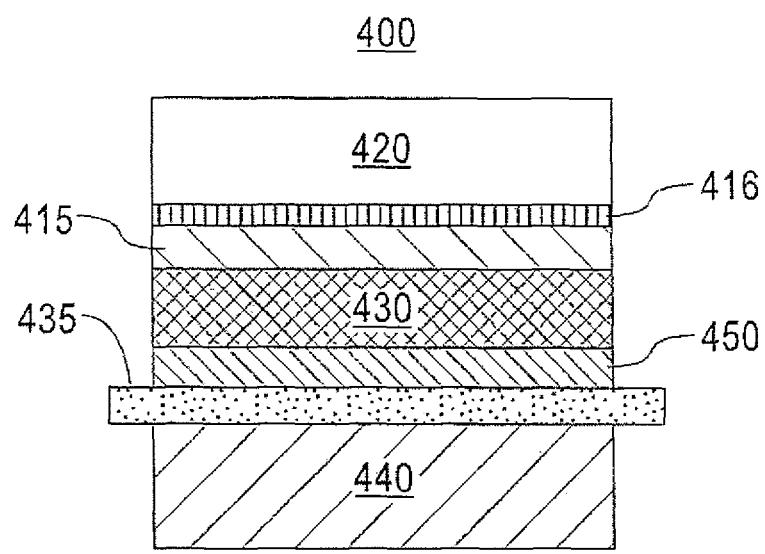

As shown in FIG. 4D, the interfacial release layer 450, along with the attached semiconductor layer 430, is transferred and bonded to the epoxy adhesive 435 on the handle substrate 440 using pressure to substantially uniformly distribute the epoxy adhesive 435 on at least a portion of a front surface 442 of the handle substrate 440, thereby facilitating a substantially bubble-free epoxy adhesive bond between the handle substrate 440 and the semiconductor layer 430. The UV releasable tape 425 is removed from the stressor layer 420 after epoxy curing.

Figure 4E:
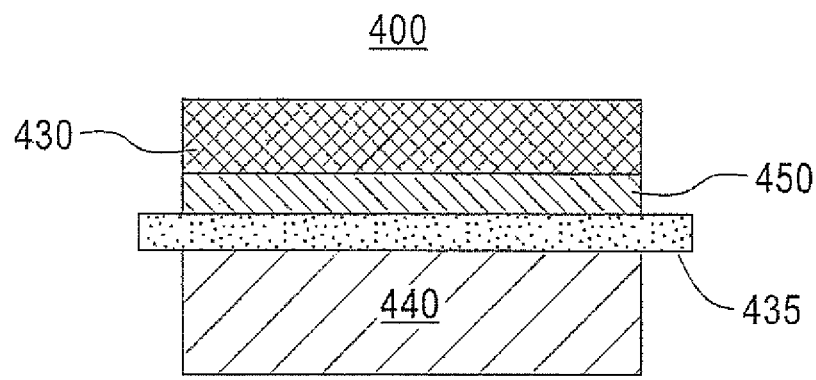

As shown in FIG. 4E, some or all of the stressor layer stack 410 is removed from the semiconductor layer 430 (for example, by an etching process or an acid wash). Processing steps (e.g., patterning, thermal treatments (such as heating, if necessary), film depositions, thinning and etching of semiconductor layer 430, and the like) are then performed on the semiconductor layer 430 as well as on any layers thereupon formed (e.g., from the patterning, film depositions) to form a processed semiconductor layer 430 that is flexible upon release from handle substrate 440.

Figure 4F:
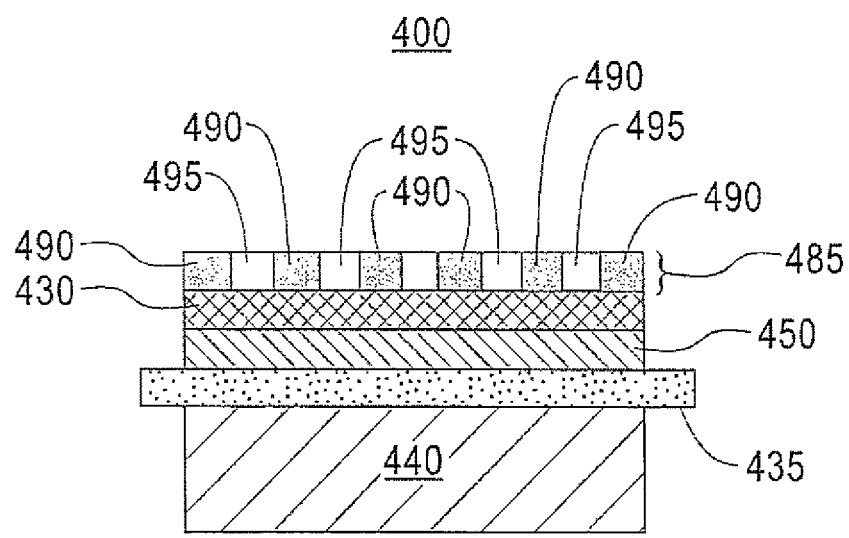
FIG. 4F is a schematic representation of depositing a back surface field layer on the flexible semiconductor device of FIGS. 4A through 4E.

Referring now to FIG. 4F, once some or all of the stressor layer stack 410 is removed from the semiconductor layer 430, the processing on the back surface may comprise application of a back surface field (BSF) layer (hereinafter "BSF 485") to the semiconductor layer 430. The BSF 485 may comprise localized BSF regions or contact regions 490 and back reflector elements 495. The BSF 485 may be a low-temperature BSF comprised of low-temperature deposited (less than about 450° C.) silicon dioxide back-reflector elements 495 with an array of, openings filled with evaporated or sputtered metal contact regions 490. Part of the back surface field could be formed in the surface of semiconductor layer 430 prior to the separation step depicted in FIGS. 4A and 4B. For example, Al may be evaporated and diffused into the surface of handle substrate 430 (FIG. 4A) prior to depositing a Ti adhesion layer 415 to form a back surface field before separation.

Figure 4G:
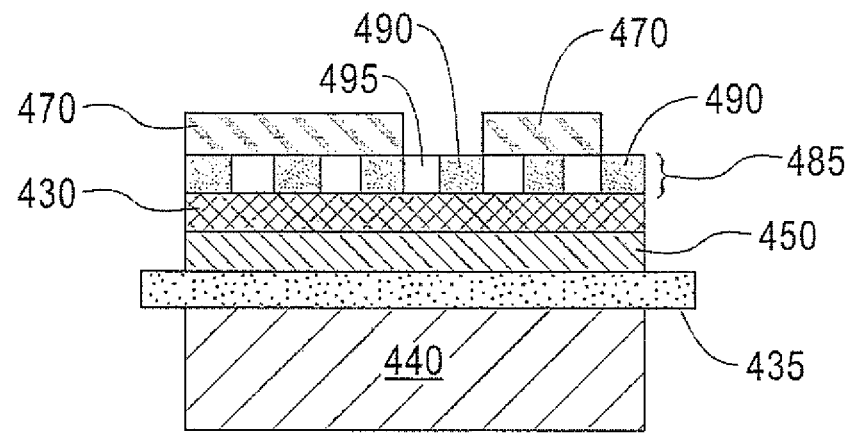
FIGS. 4G and 4H are schematic representations of forming and isolating cells in the flexible semiconductor device of FIGS. 4A through 4F using a blanket layer of hardmask.
Figure 4H:
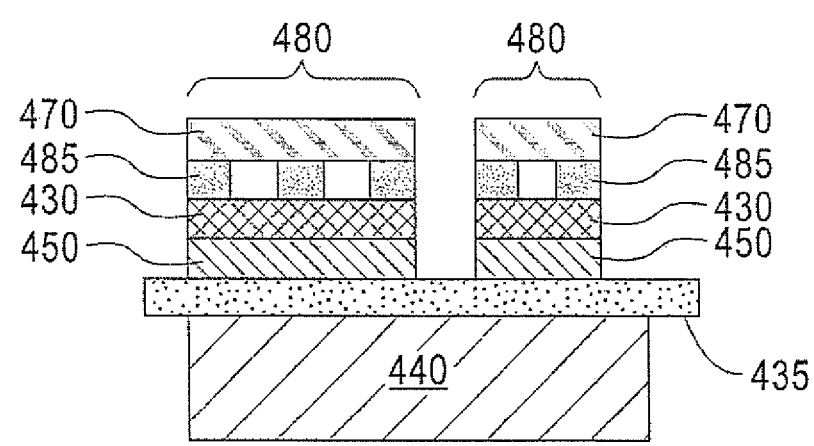

As shown in FIGS. 4G and 4H, optional processing can be provided to include cell isolation. In various exemplary embodiments of isolating cells in the flexible semiconductor layer 430, a blanket layer of hardmask 470 may be deposited on the BSF 485 and patterned and etched through a photoresist (PR) mask or a shadow mask, and/or laser scribing may be used. A contiguous region of the semiconductor layer 430 may be identified, such a region including a majority of the surface of the semiconductor layer. The processing may include the forming of a cell front structure on the region defined by the majority of the surface.

Figure 4I:
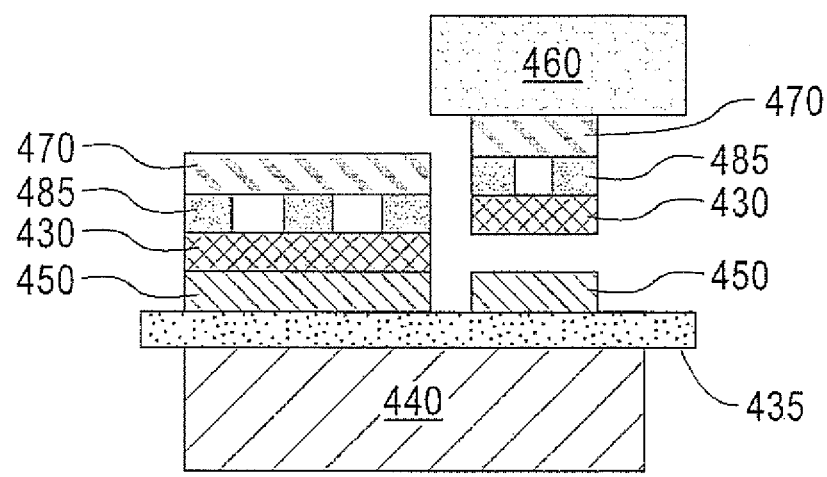
FIG. 4I is a schematic representation of using pressure-sensitive carrier tape to remove the flexible semiconductor device from the release layer.

As shown in FIG. 4I, a conductive, flexible pressure-sensitive carrier tape 460 (which may be conductive) may be disposed on the hardmask 470 and used to remove a portion of the flexible semiconductor layer 430 from the interfacial release layer 450 (and the underlying epoxy adhesive 435 and the handle substrate 440). The flexible semiconductor layer 430 on the flexible pressure-sensitive carrier tape 460 may include cell back structure between the flexible pressure-sensitive carrier tape 460 and the flexible semiconductor layer 430. Cell front processing may then be completed (if desired) with the semiconductor on the flexible pressure-sensitive carrier tape 460.

As shown in FIGS. 5A through 5L, another exemplary method of producing a semiconductor device is shown generally at 500 and is hereinafter referred to as "method 500." In method 500, variations of providing flexible semiconductor devices in which fronts of the semiconductor devices are processed before backs of the semiconductor devices are processed are shown. The front processing may be performed before the backing layer application and removal or after the backing layer removal (as shown in FIGS. 5A through 5L). The back processing may be performed (if desired) with the semiconductor device on a carrier tape. A semiconductor device fabricated by the method 500 allows for some device testing prior to transfer of the semiconductor device to the carrier tape.

Figure 5A:
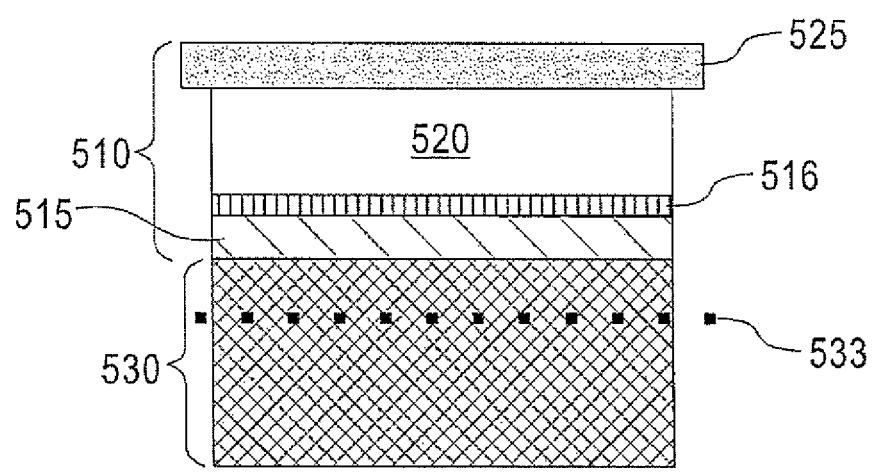
FIGS. 5A through 5E are schematic representations of exemplary methods of forming and temporarily bonding a flexible semiconductor device to a rigid handle substrate using a release layer.

As shown in FIG. 5A, a spall-inducing stressor layer stack 510 is formed and deposited onto a substrate comprising a semiconductor material (e.g., a 100-oriented silicon material forming a substrate or any material selected from the group consisting of silicon, germanium, SiGe, bulk III-V materials, any of the foregoing materials further including epitaxially grown semiconductor layers, any of the foregoing materials further including doped layers, metallic layers, and/or passivating layers, and combinations of the foregoing) forming a semiconductor layer 530 configured to have an exposed front surface and a back surface that receives the stressor layer stack 510. A contact-hole patterned passivation layer may also be deposited on the semiconductor layer 530, with a blanket conductive layer in contact with the passivation layer and the semiconductor layer 530 exposed by the contact-holes. The stressor layer stack 510 comprises an adhesion layer 515 of titanium deposited on the back surface of the semiconductor layer 530 as well as a seed layer 516 of nickel deposited on the adhesion layer 515, deposition being by, for example, sputtering. A stressor layer 520 of nickel may be deposited onto the seed layer. An ultraviolet (UV) releasable tape 525 may then be applied to the stressor layer 520.

Figure 5B:
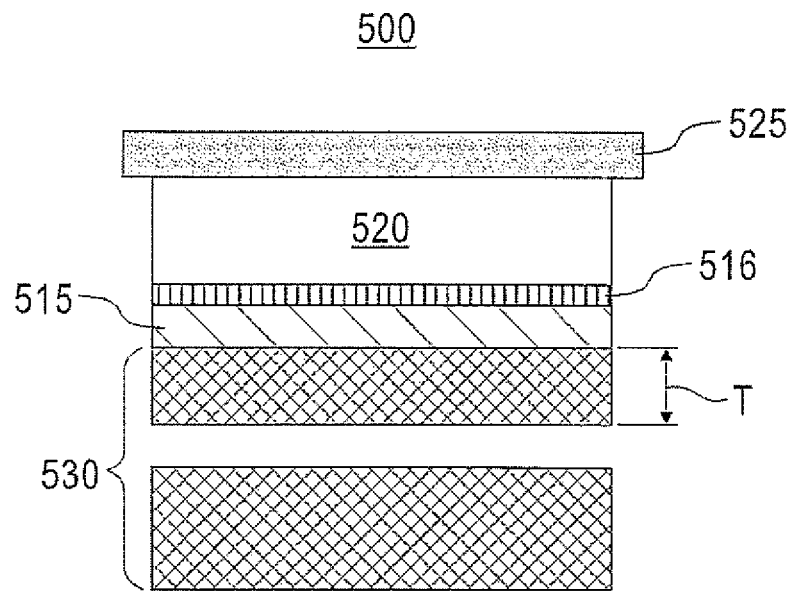

The semiconductor layer 530 may be separated at a plane 533 extending longitudinally through the semiconductor layer 530 parallel to the adhesion layer 515. Separation of the semiconductor layer 530 may result in the configuration of the stressor layer stack 510 having the semiconductor layer 530 of reduced thickness T as shown in FIG. 5B.

Figure 5C:
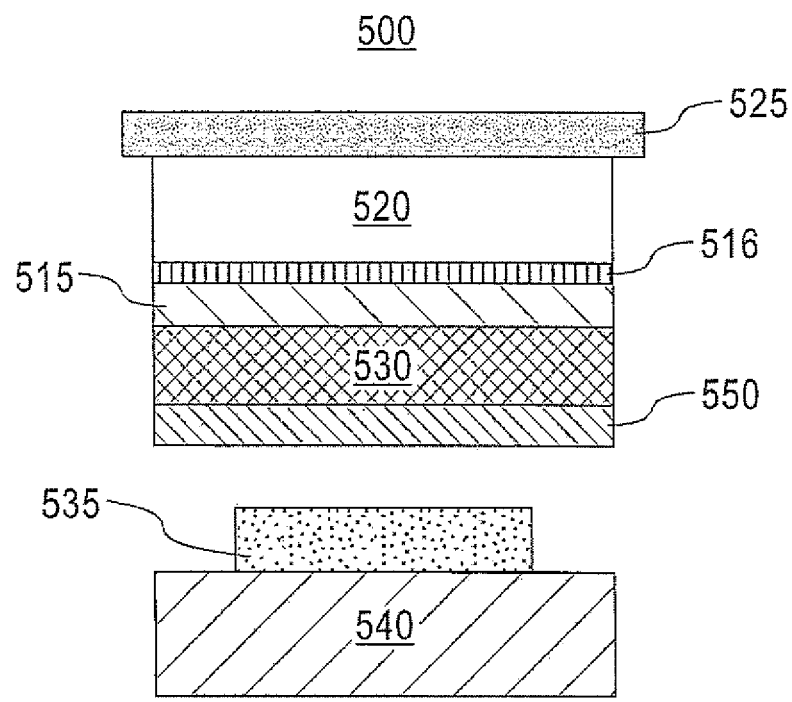

As shown in FIG. 5C, an interfacial release layer 550 is formed on an exposed surface of the semiconductor layer 530 prior to bonding of the stressor layer stack 510 and the semiconductor layer 530 to the epoxy adhesive 535 on a handle substrate 540. When the semiconductor layer 530 comprises a silicon or silicon oxide-containing semiconductor material, the interfacial release layer 550 comprises aluminum. However, while aluminum on a native silicon oxide-containing semiconductor material provides a suitable interfacial release layer 550, other materials (alone or in combination with aluminum) may be used as well. For example, carbon or hydrocarbon contamination may be introduced to the silicon surface prior to the aluminum deposition. Suitable methods for depositing the aluminum interfacial release layer 550 onto the semiconductor layer 530 include, but are not limited to, thermal evaporation.

Figure 5D:
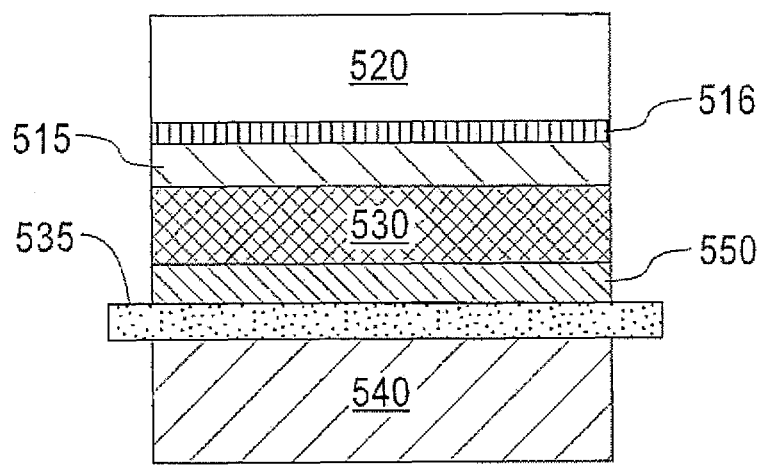

As shown in FIG. 5D, the interfacial release layer 550, along with the attached semiconductor layer 530, is transferred and bonded to the epoxy adhesive 535 on the handle substrate 540 using pressure to substantially uniformly distribute the epoxy adhesive on at least a portion of the front surface 542 of the handle substrate 540, thereby facilitating a substantially bubble-free epoxy adhesive bond between the handle substrate 540 and the semiconductor layer 530. The UV releasable tape 525 is removed from the stressor layer 520 after the epoxy curing step.

Figure 5E:
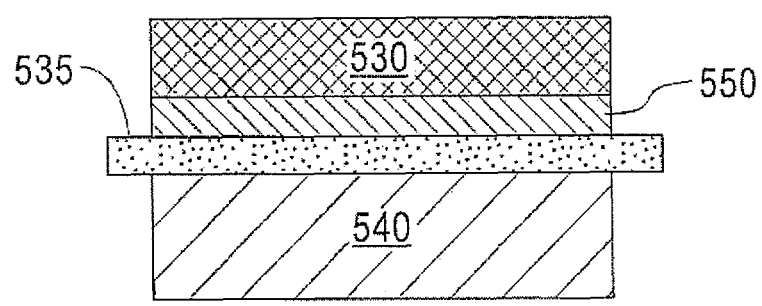

As shown in FIG. 5E, some or all of the stressor layer stack 510 is removed from the semiconductor layer 530 (for example, by an etching process or an acid wash). Processing steps (e.g., patterning, thermal treatments (such as heating, if necessary), film depositions, and the like) are then performed on the semiconductor layer 530 as well as on any layers thereupon formed (e.g., from the patterning, film depositions) to form a processed semiconductor layer 530 that is flexible upon release from handle substrate 540.

Figure 5F:
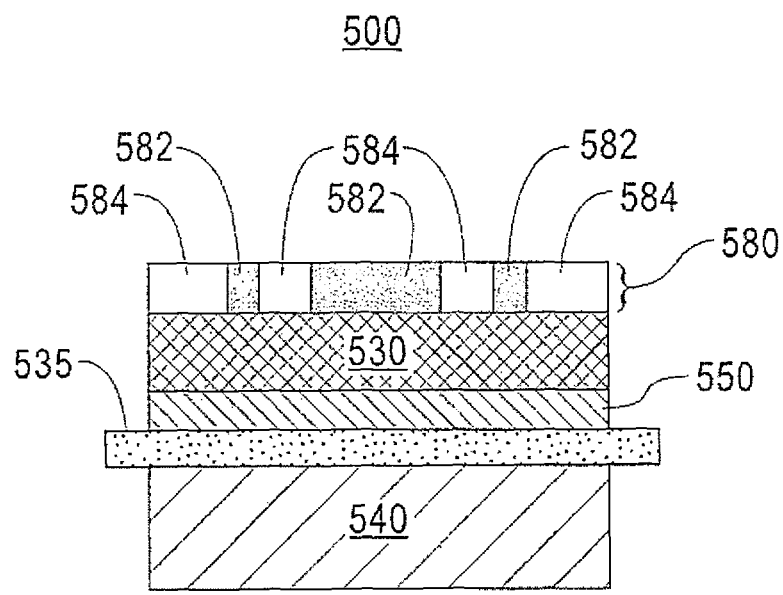
FIGS. 5F through 5I are schematic representations of depositing a finger/bus and sacrificial mask on the flexible semiconductor device of FIGS. 5A through 5E.

Referring now to FIG. 5F, a layer 580 comprising a finger/bus metal 582 and an anti-reflective coating (ARC) 584 is deposited on the flexible semiconductor layer 530. Methods by which the finger/bus metal 582 is deposited include, but are not limited to, evaporation, sputtering, electroplating, or combinations thereof. Materials typically used for the finger/bus metal include, but are not limited to, Ti, Ni, Pd, Au, Ni, Cu, Ge, Al, Ag, and combinations thereof. Methods by which the anti-reflective coating (ARC) 584 is deposited include evaporation, sputtering, atomic layer deposition (ALD), or other chemical vapor deposition (CVD) based processes. Typical materials used for ARC 584 include, but are not limited to, oxides and nitrides of semiconductors and metals (e.g., silicon oxide or nitride, aluminum oxide, magnesium oxide, etc.) and combinations thereof.

Figure 5G:
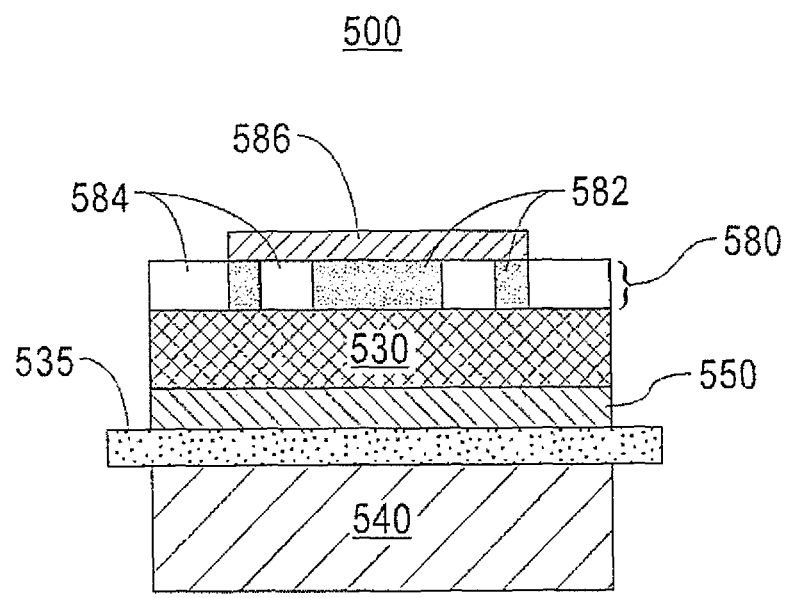
Figure 5H:
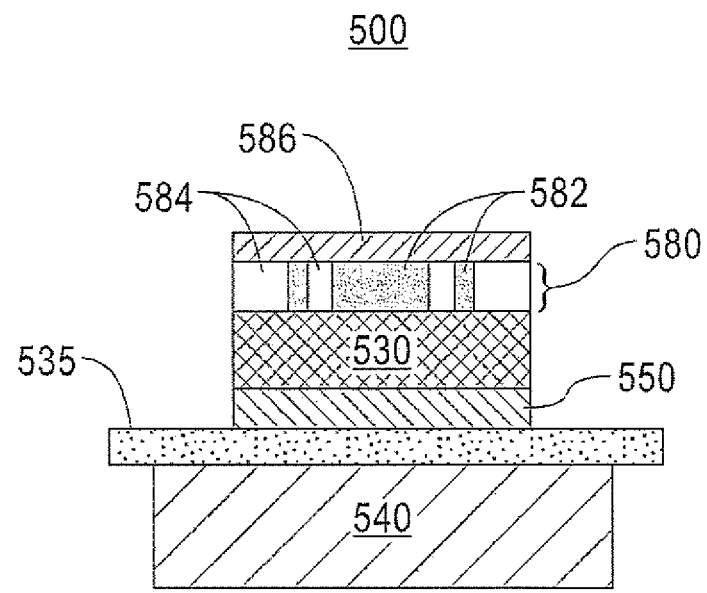

Referring now to FIGS. 5G and 5H, a sacrificial mask 586 is deposited on a portion of the layer 580 comprising the finger/bus metal 582, and an etching process may be used to remove portions of the layer 580, the flexible semiconductor layer 530, and the interfacial release layer 550 down to the epoxy adhesive 535 to pattern the layer 580. The etching process used may comprise wet or dry etching to isolate the cell defined by the sacrificial mask 586.

Figure 5I:
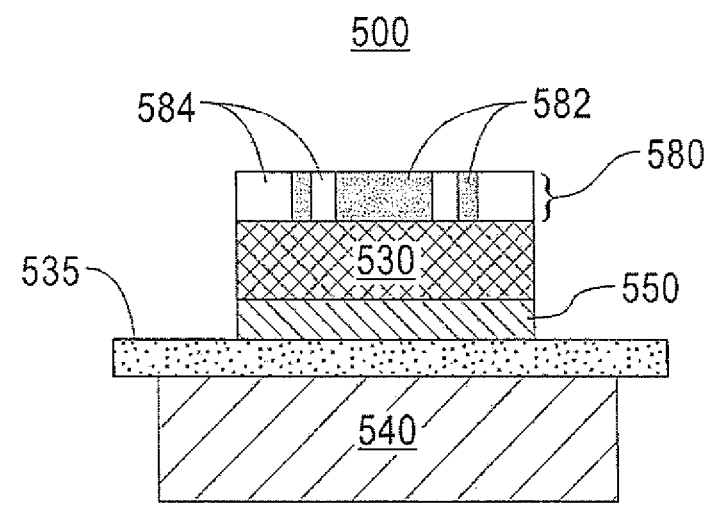

Referring now to FIG. 5I, the sacrificial mask 586 is removed using any suitable etching process.

Figure 5J:
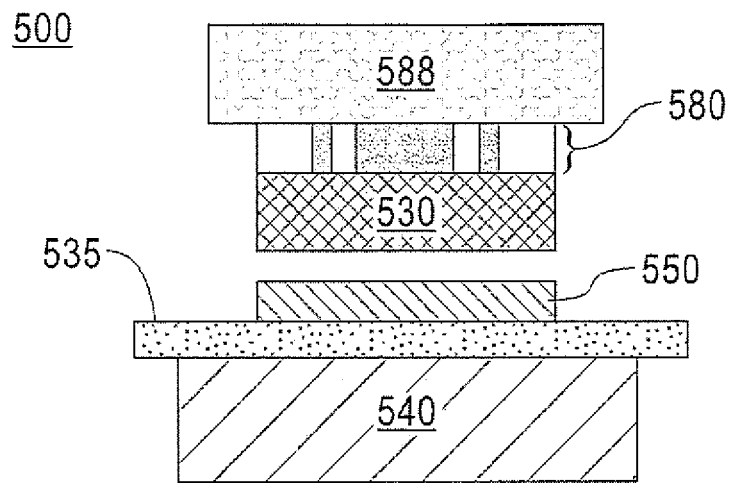
FIGS. 5J and 5K are schematic representations of disposing a tape superstrate on the flexible semiconductor device of FIGS. 5A through 5I to remove the flexible semiconductor device from the release layer.
Figure 5K:
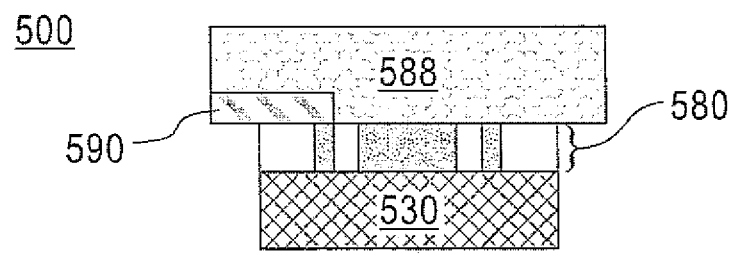

Referring now to FIGS. 5J and 5K, a tape superstrate 588 is deposited on the remaining exposed layer 580, and the flexible semiconductor layer 530 is removed from the interfacial release layer 550. As shown in FIG. 5K, the tape superstrate 588 may include a metal portion to provide a contact 590 to the finger/bus metal 582 of the layer 580. Use of the tape superstrate 588 is particularly useful when the tape superstrate 588 is transparent and compatible with the front contact (e.g., when the tape superstrate 588 includes contact holes).

Figure 5L:
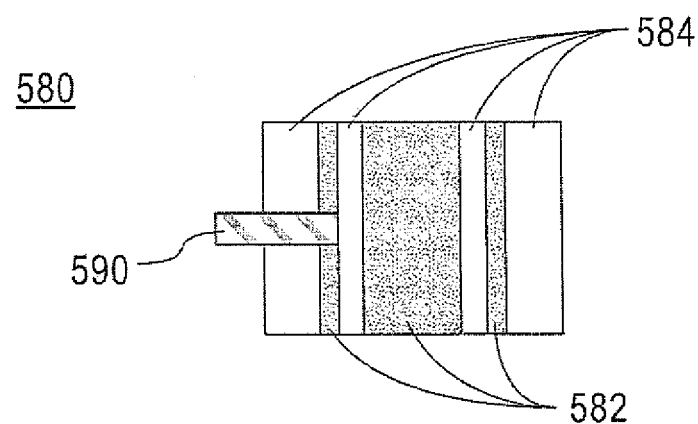
FIG. 5L is a schematic representation of a contact on the flexible semiconductor device of FIGS. 5A through 5K after removing the superstrate.

Referring now to FIG. 5L, the tape superstrate 588 is removed, the contact 590 remains on the layer 580.

Figure 6:
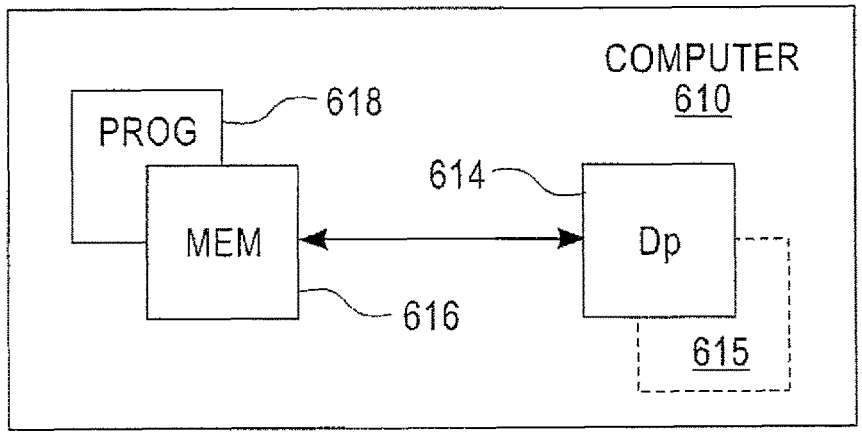
FIG. 6 is a simplified block diagram of exemplary electronic devices that are suitable for use in the fabrication of flexible semiconductor layers and devices on flexible carriers.

Referring now to FIG. 6, a simplified block diagram of various electronic devices and apparatus that are suitable for use in practicing the exemplary embodiments described herein is shown. For example, a computer 610 may be used to control one or more of the fabrication processes as described above. The computer 610 includes a controller, such as a computer or a data processor (DP) 614 and a computer-readable memory medium embodied as a memory (MEM) 616 that stores a program of computer instructions (PROG) 618.

The PROG 618 includes program instructions that, when executed by the associated DP 614, enable the various electronic devices and apparatus to operate in accordance with exemplary embodiments. That is, various exemplary embodiments may be implemented at least in part by computer software executable by the DP 614 of the computer 610, or by hardware, or by a combination of software and hardware (and firmware).

The computer 610 may also include dedicated processors, for example flexible semiconductor modeling processor 615.

The computer readable MEM 616 may be of any type suitable to the local technical environment and may be implemented using any suitable data storage technology, such as semiconductor based memory devices, flash memory, magnetic memory devices and systems, optical memory devices and systems, fixed memory, and removable memory. The DP 614 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the method.

Based on the foregoing it should be apparent that various exemplary embodiments provide a method to fabricate flexible semiconductor layers and devices on flexible carriers.

Figure 7:
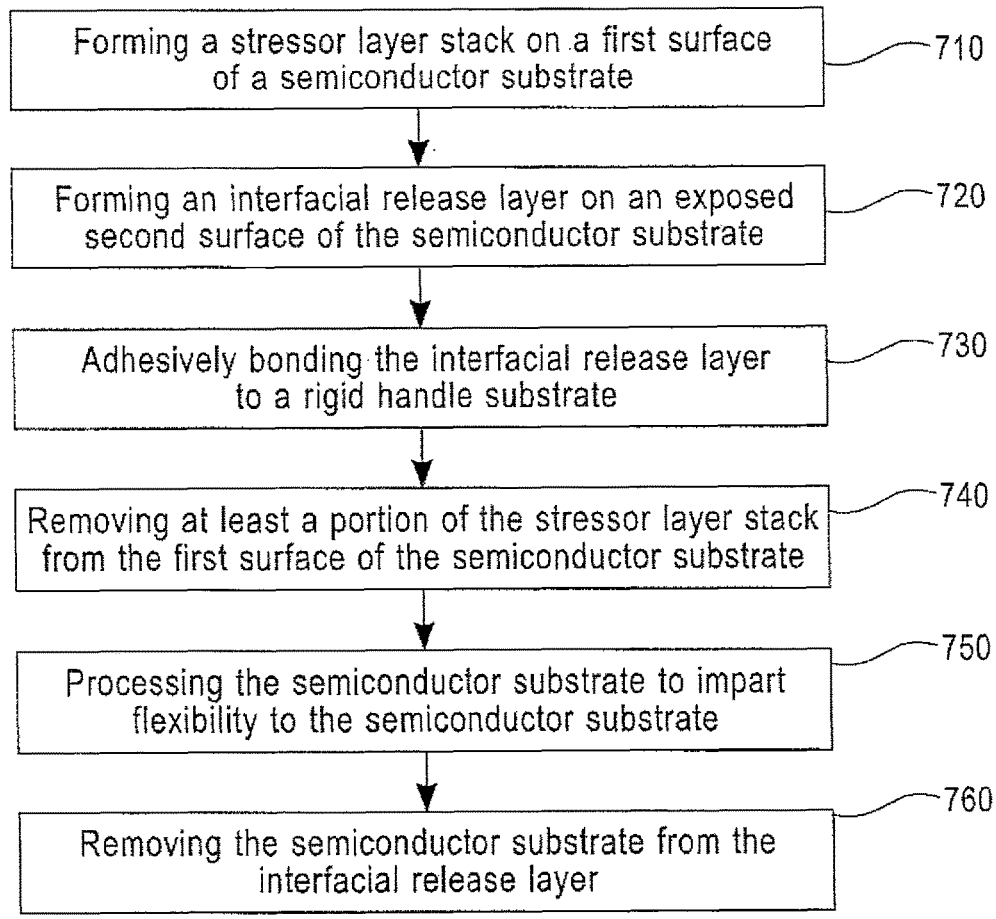
FIG. 7 is a logic flow diagram that illustrates the operation of an exemplary method, and a result of execution of computer program instructions embodied on a computer readable memory, in accordance with an exemplary embodiment of the fabrication of flexible semiconductor layers and devices on flexible carriers.

FIG. 7 is a logic flow diagram that illustrates the operation of a method 700 (and a result of an execution of computer program instructions (such as PROG 618)), in accordance with the exemplary embodiments. In accordance with these exemplary embodiments, a stressor layer stack is formed on a first surface of a semiconductor substrate at block 710. An interfacial release layer is subsequently formed on an exposed second surface of the semiconductor substrate at block 720. At block 730, the interfacial release layer is then adhesively bonded to a rigid handle substrate using an epoxy. At least a portion of the stressor layer stack is removed from the first surface of the semiconductor substrate at block 740. At block 750, the semiconductor substrate is then processed to impart flexibility to the semiconductor substrate. At block 760, the semiconductor substrate is then removed from the interfacial release layer.

The various blocks of method 700 shown in FIG. 7 may be viewed as method steps, and/or as operations that result from operation of computer program code, and/or as a plurality of coupled logic circuit elements constructed to carry out the associated function(s).

EXAMPLE

In one example of a method of using an interfacial release layer as described in FIGS. 2A through 2E, the stressor layer stack 210 was deposited on a 100-oriented silicon (Si) substrate (semiconductor layer 230) to form a silicon film. The stressor layer stack 210 included the adhesion layer 215 of titanium (Ti) (150 nanometers (nm) in thickness) and the seed layer of nickel (Ni) (400 nm in thickness), both deposited by sputtering, and the stressor layer 220 of electroplated Ni (5 micrometers (μm) in thickness) on top of the seed layer of Ni. The Ni was electroplated on a 2 inch diameter area of the Si substrate. The UV releasable tape 225 was then applied to the stressor layer 220 to induce the spalling.

After the Si film was spalled, a 300 nm aluminum (Al) layer was thermally evaporated on the spalled Si surface without removing the native oxide formed on the Si film after spalling, the Al layer forming the interfacial release layer 250. The Al side of the resulting flexible film assembly (tape/stressor layer/Si/Al), which formed the interfacial release layer 250, was bonded with the epoxy adhesive 235 to the handle substrate 240, which had been coated with 300 nm of thermally evaporated Al. This metal layer exhibited suitable adhesion with the epoxy adhesive 235. The epoxy adhesive 235 used was an electrically conductive silver-filled epoxy (Ablebond 2030SC®, which is available from Henkel North America). A pressure was applied during the curing process by applying a weight on the top of the sample. The curing temperature was 80 degrees C., with a curing time of 1 hour 15 minutes.

After the curing process was finished, the UV releasable tape 225 was then removed by exposure to UV light. The Ni stressor layer 220 and the Ti adhesion layer 215 were removed with selective chemical etchants. Using the UV releasable tape 225 as a flexible substrate, the silicon film was released from the interfacial release layer 250. This was possible because the adhesion of Al in the interfacial release layer 250 to the spalled silicon film is weaker than the adhesion of Al in the interfacial release layer 250 to the epoxy. It was speculated that the weak Al to Si adhesion was a result of surface contaminants present on the untreated silicon film surface prior to Al thermal evaporation. Different photos of the sample corresponding to the steps of FIGS. 2C, 2D, and 2E are shown in FIGS. 8A through 8D.

Figure 8A:
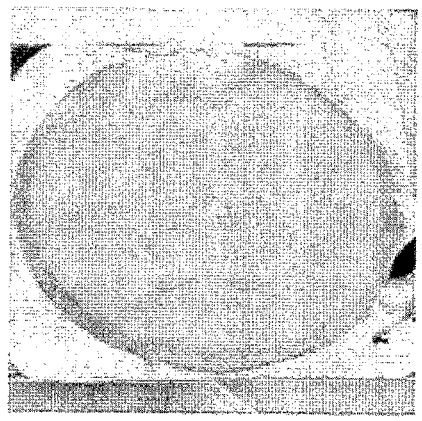
FIGS. 8A through 8D are photographs of the silicon film transfer of FIGS. 2C through 2E at various stages.
Figure 8B:
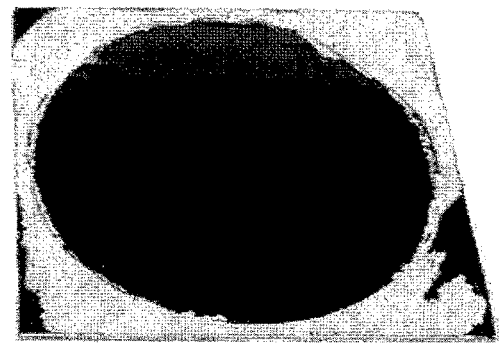
Figure 8C:
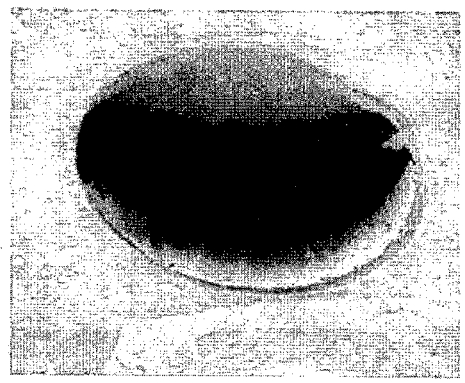
Figure 8D:
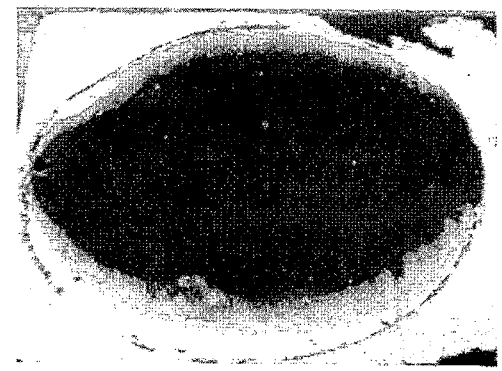

Referring now to FIGS. 8A through 8D, images of the silicon film transfer at various stages of method 200 are shown. In FIG. 8A, a top view image of the nickel seed layer (corresponding to FIG. 2C) is shown. In FIG. 8B, a top view image of the semiconductor layer 230 with the Ni seed layer and the Ti adhesion layer 215 removed (corresponding to FIG. 2D) is shown. In FIG. 8C, a top view image of the flexible semiconductor layer 230 (e.g., showing the silicon of the 100-oriented silicon substrate) with the pressure-sensitive carrier tape 260 down (corresponding to the upper portion of FIG. 2E) is shown. In FIG. 8D, the interfacial release layer 250 from which the flexible semiconductor layer 230 is removed (corresponding to the lower portion of FIG. 2E) is shown.

In one example embodiment, a method for fabricating a semiconductor device comprises providing a preformed spalled structure comprising a stressor layer stack on a first surface of a semiconductor substrate; forming an interfacial release layer on an exposed second surface of the semiconductor substrate; adhesively bonding the interfacial release layer to a rigid handle substrate using an epoxy; removing at least a portion of the stressor layer stack from the first surface of the semiconductor substrate; processing the semiconductor substrate; and removing the semiconductor substrate from the interfacial release layer to impart flexibility to the semiconductor substrate.

Forming a stressor layer stack on a first surface of a semiconductor substrate may comprise depositing an adhesion layer on the semiconductor substrate, depositing a seed layer on the adhesion layer, depositing a stressor layer on the seed layer, and applying a releasable tape to the stressor layer. Forming an interfacial release layer on an exposed second surface of the semiconductor substrate may comprise thermally evaporating an aluminum-containing compound on the semiconductor substrate. The method may further comprise introducing a contaminant to a surface of the semiconductor substrate prior to thermally evaporating an aluminum-containing compound on the semiconductor substrate. Removing the semiconductor substrate from the interfacial release layer may comprise separating the semiconductor substrate from the interfacial release layer using a pressure-sensitive carrier tape. Processing the semiconductor substrate prior to removing the semiconductor substrate from the interfacial release layer may comprise one or more of patterning the semiconductor substrate, thermally treating the semiconductor substrate, and depositing a film on the semiconductor substrate. The method may further comprise separating the semiconductor substrate along a plane extending longitudinally through the semiconductor substrate parallel to the interfacial release layer to reduce a thickness of the semiconductor substrate. The method may further comprise isolating cells in the semiconductor substrate. Isolating cells in the semiconductor substrate may comprise applying a hardmask to the semiconductor substrate and etching exposed semiconductor substrate down to the epoxy. The method may further comprise applying a pressure-sensitive tape to the hardmask to remove the semiconductor substrate from the interfacial release layer. The method may still further comprise removing the hardmask and applying a pressure-sensitive tape to the hardmask to remove the semiconductor substrate from the interfacial release layer.

In another example embodiment, a method for fabricating a semiconductor device comprises providing a preformed spalled structure comprising a stressor layer stack on a first surface of a semiconductor substrate; forming an interfacial release layer on a second exposed surface of the semiconductor substrate; bonding the interfacial release layer to a rigid handle substrate using an epoxy adhesive; removing at least a portion of the stressor layer stack from the semiconductor substrate; processing the semiconductor substrate; applying a back surface field layer to the semiconductor layer; isolating cells in the back contact layer and the semiconductor substrate; and removing the semiconductor substrate from the interfacial release layer using a pressure-sensitive carrier tape to impart flexibility.

Isolating cells in the back contact layer and the semiconductor substrate may comprise patterning the back contact layer and etching the back contact layer and semiconductor substrate down to the epoxy adhesive. Patterning the back contact layer may comprise applying a hardmask to the back contact layer. Etching the back contact layer and semiconductor substrate may comprise one or more of etching through a photoresist mask, etching through a shadow mask, and laser scribing.

In another example embodiment, a method for fabricating a semiconductor device comprises providing a preformed spalled structure comprising a stressor layer stack on a first surface of a semiconductor substrate; forming an interfacial release layer on a second exposed surface of the semiconductor substrate; bonding the interfacial release layer to a rigid handle substrate using an epoxy adhesive; removing at least a portion of the stressor layer stack from the semiconductor substrate; processing the semiconductor substrate; forming a layer comprising a finger/bus metal and an anti-reflective coating on the semiconductor substrate; applying a sacrificial mask to the layer comprising the finger/bus metal and the anti-reflective coating; patterning the layer comprising the finger/bus metal and the anti-reflective coating; removing the sacrificial mask; and removing the semiconductor substrate from the interfacial release layer using a tape superstrate to impart flexibility.

Processing the semiconductor substrate may comprise one or more of patterning the semiconductor substrate, thermally treating the semiconductor substrate, and depositing a film on the semiconductor substrate. The method may further comprise etching portions of the layer comprising the finger/bus metal and the anti-reflective coating down to the epoxy adhesive. The method may further comprise providing a metal portion in the tape superstrate to provide a contact to the finger/bus metal.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A method for fabricating a semiconductor device, comprising:
   providing a structure comprising a stressor layer stack on a first surface of a semiconductor substrate;
   forming an interfacial release layer on an exposed second surface of the semiconductor substrate;
   adhesively bonding the interfacial release layer to a rigid handle substrate using an epoxy;
   removing at least a portion of the stressor layer stack from the first surface of the semiconductor substrate;
   processing the semiconductor substrate by isolating cells in the semiconductor substrate by applying a hardmask to the semiconductor substrate and etching exposed semiconductor substrate down to the epoxy; and
   removing the hardmask and applying a pressure-sensitive tape to the semiconductor substrate to remove the semiconductor substrate from the interfacial release layer;
   wherein processing the semiconductor substrate further comprises one or more of patterning the semiconductor substrate, thermally treating the semiconductor substrate, thinning the semiconductor substrate, and depositing a film on the semiconductor substrate.

2. The method of claim 1, wherein forming an interfacial release layer on an exposed second surface of the semiconductor substrate comprises thermally evaporating an aluminum-containing compound on the semiconductor substrate.

3. The method of claim 2, further comprising introducing a contaminant to a surface of the semiconductor substrate prior to thermally evaporating an aluminum-containing compound on the semiconductor substrate.

4. The method of claim 1, wherein adhesively bonding the interfacial release layer to a rigid handle substrate using an epoxy comprises using pressure to substantially uniformly distribute the epoxy on at least a portion of the handle substrate to facilitate a substantially bubble-free bond between the handle substrate and the semiconductor substrate.

5. The method of claim 1, wherein the semiconductor substrate comprises 100-oriented silicon material.

6. The method of claim 1, wherein the semiconductor substrate is a material selected from the group consisting of silicon, germanium, SiGe, bulk III-V materials, any of the foregoing materials further including epitaxially grown semiconductor layers, any of the foregoing materials further including doped layers, metallic layers, and/or passivating layers, and combinations of the foregoing materials.

7. The method of claim 1, wherein the semiconductor substrate comprises a silicon or silicon-containing semiconductor material and the interfacial release layer comprises aluminum.

8. The method of claim 1, wherein the releasable tape applied to the stressor layer is a UV releasable tape.

9. The method of claim 1, further comprising separating the semiconductor substrate along a plane extending longitudinally through the semiconductor substrate parallel to the first surface of the semiconductor substrate to reduce a thickness of the semiconductor substrate and expose a second surface of the semiconductor substrate.

10. The method of claim 9, wherein separating the semiconductor substrate along a plane extending longitudinally through the semiconductor substrate comprises mechanically guiding the at least a portion of the stressor layer stack to induce and sustain a spalling mode fracture.

11. A method for fabricating a semiconductor device, comprising:
   providing a structure comprising a stressor layer stack on a first surface of a semiconductor substrate;
   forming an interfacial release layer on an exposed second surface of the semiconductor substrate;
   adhesively bonding the interfacial release layer to a rigid handle substrate using an epoxy;
   removing at least a portion of the stressor layer stack from the first surface of the semiconductor substrate;
   processing the semiconductor substrate by isolating cells in the semiconductor substrate by applying a hardmask to the semiconductor substrate and etching exposed semiconductor substrate down to the epoxy; and
   removing the hardmask and applying a pressure-sensitive tape to the semiconductor substrate to remove the semiconductor substrate from the interfacial release layer;
   wherein adhesively bonding the interfacial release layer to a rigid handle substrate using an epoxy comprises using pressure to substantially uniformly distribute the epoxy on at least a portion of the handle substrate to facilitate a substantially bubble-free bond between the handle substrate and the semiconductor substrate.

12. The method of claim 11, wherein providing a structure comprising a stressor layer stack comprises forming the stressor layer stack by
   depositing an adhesion layer on the semiconductor substrate,
   depositing a seed layer on the adhesion layer,
   depositing a stressor layer on the seed layer, and
   applying a releasable tape to the stressor layer.

13. The method of claim 11, wherein the semiconductor substrate comprises 100-oriented silicon material.

14. A method for fabricating a semiconductor device, comprising:
   providing a structure comprising a stressor layer stack on a first surface of a semiconductor substrate;
   forming an interfacial release layer on an exposed second surface of the semiconductor substrate;
   adhesively bonding the interfacial release layer to a rigid handle substrate using an epoxy;
   removing at least a portion of the stressor layer stack from the first surface of the semiconductor substrate;
   processing the semiconductor substrate by isolating cells in the semiconductor substrate by applying a hardmask to the semiconductor substrate and etching exposed semiconductor substrate down to the epoxy; and
   removing the hardmask and applying a pressure-sensitive tape to the semiconductor substrate to remove the semiconductor substrate from the interfacial release layer;
   further comprising separating the semiconductor substrate along a plane extending longitudinally through the semiconductor substrate parallel to the first surface of the semiconductor substrate to reduce a thickness of the semiconductor substrate and expose a second surface of the semiconductor substrate.

15. The method of claim 14, wherein providing a structure comprising a stressor layer stack comprises forming the stressor layer stack by
   depositing an adhesion layer on the semiconductor substrate,
   depositing a seed layer on the adhesion layer,
   depositing a stressor layer on the seed layer, and
   applying a releasable tape to the stressor layer.

16. The method of, claim 14, wherein the semiconductor substrate comprises 100-oriented silicon material.

* * * * *